US006984852B2

(12) United States Patent
Wang et al.

(10) Patent No.: US 6,984,852 B2
(45) Date of Patent: Jan. 10, 2006

(54) PACKAGE STRUCTURE FOR LIGHT EMITTING DIODE AND METHOD THEREOF

(75) Inventors: Pai-Hsiang Wang, Taoyuan (TW); Chih-Sung Chang, Hsinchu (TW); Tzer-Perng Chen, Hsinchu (TW)

(73) Assignee: United Epitaxy Company, Ltd., Hsinchu (TW)

( * ) Notice: Subject to any disclaimer, the term of this patent is extended or adjusted under 35 U.S.C. 154(b) by 0 days.

(21) Appl. No.: 10/770,921

(22) Filed: Feb. 2, 2004

(65) Prior Publication Data

US 2004/0245591 A1 Dec. 9, 2004

(30) Foreign Application Priority Data

Mar. 18, 2003 (TW) ................................. 92105889

(51) Int. Cl.
*H01L 27/15* (2006.01)

(52) U.S. Cl. ........................................ 257/99; 257/676

(58) Field of Classification Search ........ 257/E33.066, 257/E33.057, E33.056, 99, 81, 676, 675
See application file for complete search history.

(56) References Cited

U.S. PATENT DOCUMENTS 6,599,768 B1 * 7/2003 Chen ........................... 438/22
6,822,269 B2 * 11/2004 Horiuchi et al. .............. 257/99
6,864,554 B2 * 3/2005 Lin et al. .................... 257/434
2002/0149312 A1 * 10/2002 Roberts et al. ............ 313/495

* cited by examiner

*Primary Examiner*—Tom Thomas
*Assistant Examiner*—Matthew C Landau
(74) *Attorney, Agent, or Firm*—Ingrassia Fisher & Lorenz PC

(57) ABSTRACT

A package structure of a light emitting diode includes a substrate structure, a connection layer, and at least one conductive passage. The substrate structure sequentially includes a conduction board, an insulation layer, and a conductive layer. The insulation layer is configured to electrically insulate the conduction board from the conductive layer, and also to insulate a first portion from a second portion of the conduction board. The substrate structure has an opening to expose the conduction board. The connection layer configured to support and electrically couple to a first electrode of a light emitting diode (LED) is disposed in the opening. The connection layer is also configured to electrically couple to the conduction board and to be electrically insulated from at least one portion of the conductive layer, which is coupled to a second electrode of the LED. The conductive passage electrically couples the second portion of the conduction board and the portion of conductive layer, which is insulated from the connection layer.

18 Claims, 11 Drawing Sheets

PACKAGE STRUCTURE FOR LIGHT EMITTING DIODE AND METHOD THEREOF

CROSS REFERENCE TO RELATED APPLICATIONS

This application claims priority to Taiwan Patent Application No. 092105889 entitled "Light Emitting diode and Package Scheme and method thereof", filed Mar. 18, 2003.

FIELD OF INVENTION

The present invention generally relates to a package structure for a light emitting diode, and more particularly, to a light emitting diode with heat dissipation ability.

BACKGROUND OF THE INVENTION

Light emitting diodes (LEDs), because of their unique structure and character of emitting lights, are different from those conventional light sources, and are more applicable to different industrial fields. For example, LEDs are characterized in small size, high reliability, and high output, so they are suitable for many kinds of devices, such as indoor or outdoor large displays. Compared to conventional tungsten lamps, the LEDs work without a filament, consume less power, and respond quicker, so they are widely applied to communication devices or electronic devices. Furthermore, white LEDs have a better illumination effect, a longer lifetime, no harmful material like mercury, a smaller size, and lower power consumption, and therefore the LED devices are advancing in the lamp market.

The operating current of a conventional LED is typically several tens to several hundreds of mAs. Therefore, the brightness of a conventional LED is not suitable for illumination. When lots of LEDs are assembled as an LED lamp to improve the brightness, the volume of the LED lamp is simultaneously multiplied, which results in the loss of its competitiveness. Therefore, to improve the brightness of a single LED is a necessary approach. However, as the LED advances in the market demanding high brightness, the operating current and power of a single LED become several times to several hundred times than those that a conventional LED requires. For example, the operating current of a high brightness LED is about several hundreds of mAs to several amps (A). As a result, the heat generated by the LED becomes an important issue. "Heat" seriously affects the performance of LEDs; for example, the thermal effect will influence the wavelength of lights emitted from the LED, reduce the brightness of lights generated from the semiconductor device, and damage the LED device. Therefore, how to dissipate heat generated by the high power LED determines the development of the LEDs.

When the operating current of LEDs increases, conventional package structures for high power LEDs cannot provide efficient heat dissipation effect. Therefore, there is a need to provide a package structure to dissipate heat generated by LEDs.

SUMMARY OF THE INVENTION

One aspect of the present invention is to provide a package structure with excellent heat dissipation ability for a light emitting diode having high operating current.

Another aspect of the present invention is to provide a package structure for multiple light emitting diodes to form a light-emitting device with higher brightness or capable of emitting lights in different colors.

A further aspect of the present invention is to provide a package structure, which can be implemented in a variety of chip package technologies.

In one embodiment of the present invention, a package structure includes a conduction board, an insulation layer, a conductive layer, a connection layer, and a passage. The conduction board has a first portion and a second portion. The insulation layer disposed between the conduction board and the conductive layer electrically insulates the conduction board from the conductive layer and electrically insulates the first portion from the second portion of the conduction board. The conductive layer has an opening, and the connection layer is embedded into the insulation layer through the opening. The connection layer supports and electrically connects a light emitting diode. The connection layer also electrically couples with the first portion of the conduction board and is electrically insulated from at least one portion of the conductive layer. The passage electrically couples the at least one portion of the conductive layer with the second portion of the conduction board.

In another embodiment of the present invention, the package structure includes a channel for insulating the connection layer from the at least one portion of the conductive layer. Furthermore, the channel divides the conductive layer into multiple portions, so that the connection layer is insulated from at least two portions of the conductive layer. Additionally, the insulation layer includes an isolation layer and an insulation channel. The isolation layer insulates the conduction board from the conductive layer, and the insulation channel insulates the first portion from the second portion of the conduction board. The connection layer has a slanted cup-like reflection surface for reflecting lights emitted from the light emitting diode. The passage can be a hole penetrating through the conductive layer, the insulation layer and the conduction board and defining an inner surface, which is coated with conductive material.

A further another aspect of the present invention is to provide a light emitting device with excellent heat dissipation ability at low cost. In a further embodiment of the present invention, a light emitting device includes the package structure described above and a light emitting diode which has a first electrode and a second electrode. The light emitting diode is disposed on the connection layer having first electrode electrically coupled therewith, and the second electrode is coupled with the portion of the conductive layer insulated from the connection layer.

In another embodiment, the present invention provides a flip chip light emitting diode with excellent heat dissipation ability and various applications of electrical connections. The light emitting diode includes a conduction board, a conductive layer, an insulation layer, a light emitting diode, and two passages. The conductive layer has an opening to expose a portion of the conduction board. The insulation layer includes an isolation layer and an insulation channel. The isolation layer disposed between the conduction board and the conductive layer electrically insulates the conduction board from the conductive layer. The insulation channel extended from the isolation layer is inserted into the conduction board and configured to electrically insulate a first portion and a second portion of the conduction board from each other. The light emitting diode disposed on the exposed portion of the conduction board has a first electrode and a second electrode which respectively couple to the first portion and the second portion of the conduction board via the exposed portion of the conduction board. The two passages electrically couples the conductive layer with the first portion and the second portion of the conduction board respectively.

Another further aspect of the present invention is to provide a method for assembling a light emitting device. The method includes a step of providing a substrate and a light emitting diode having a first electrode and a second electrode. The substrate sequentially has a conduction board, an insulation layer, and a conductive layer. A trench is formed in the conduction board to divide the conduction board into a first portion and a second portion. The trench is filled with an insulation material to form an insulation channel, which insulates the first portion from the second portion. An opening is formed in the conductive layer and the insulation layer to expose the conduction board. A connection layer formed in the opening is coupled with the first portion of the conduction board and insulated from at least one portion of the conductive layer. A hole penetrating through the substrate is formed. The hole defines an inner surface which is electroplated with a conductive material for coupling the at least one portion of the conductive layer and the second portion of the conduction board. The first electrode of the light emitting diode is coupled with the connection layer, and the second electrode is coupled with the portion of the conductive layer which is insulated from the connection layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIGS. 5A–4B illustrate a three-dimensional view and a bottom view of a fifth embodiment of the present invention;

DETAILED DESCRIPTION OF THE INVENTION

Figure 1A:
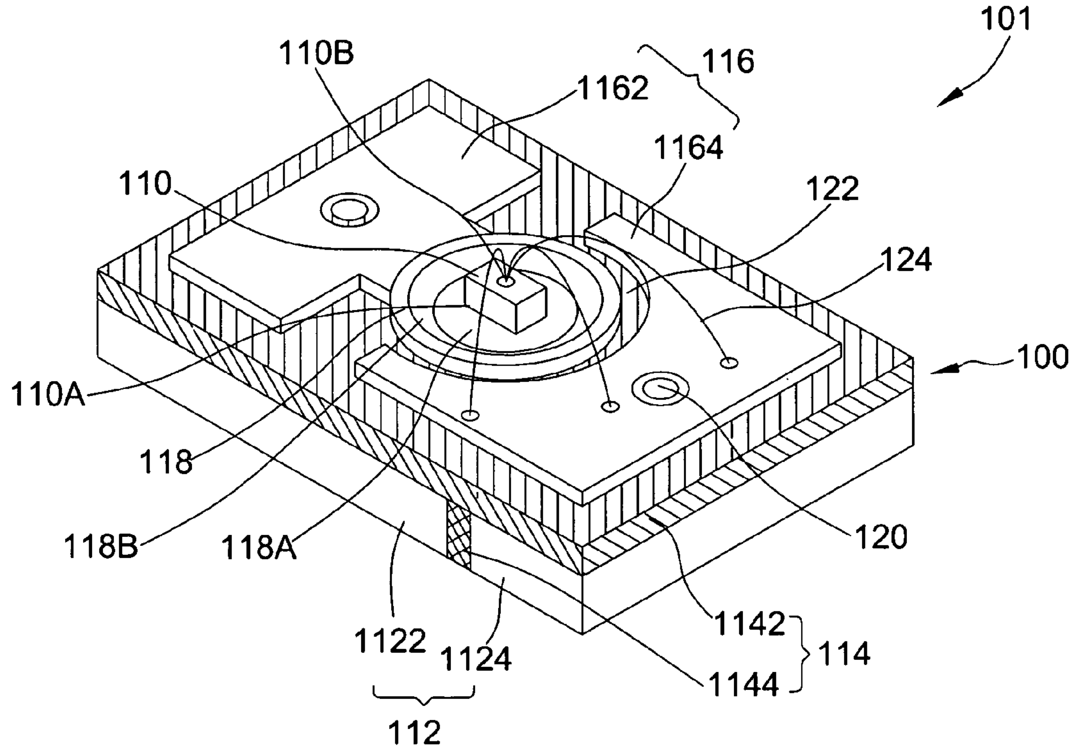
FIGS. 1A–1D illustrate a three-dimensional view, a top view, a cross-sectional view, and a bottom view of a first embodiment of the present invention.
Figure 1B:
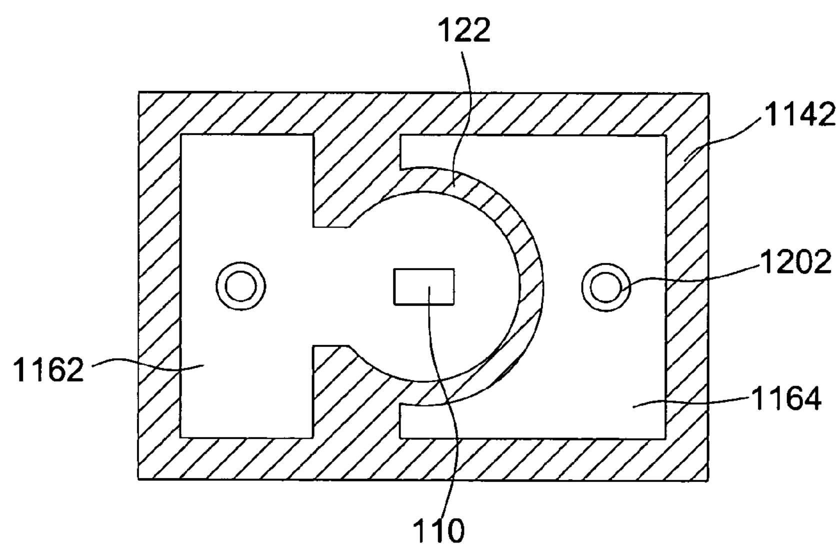
Figure 1C:
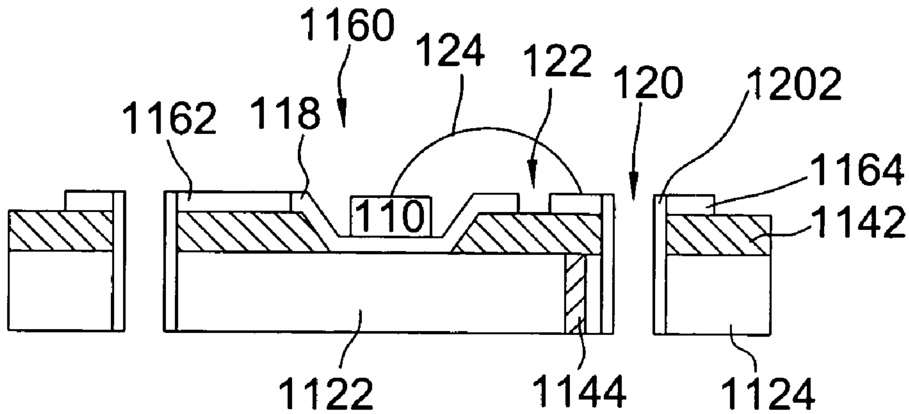
Figure 1D:
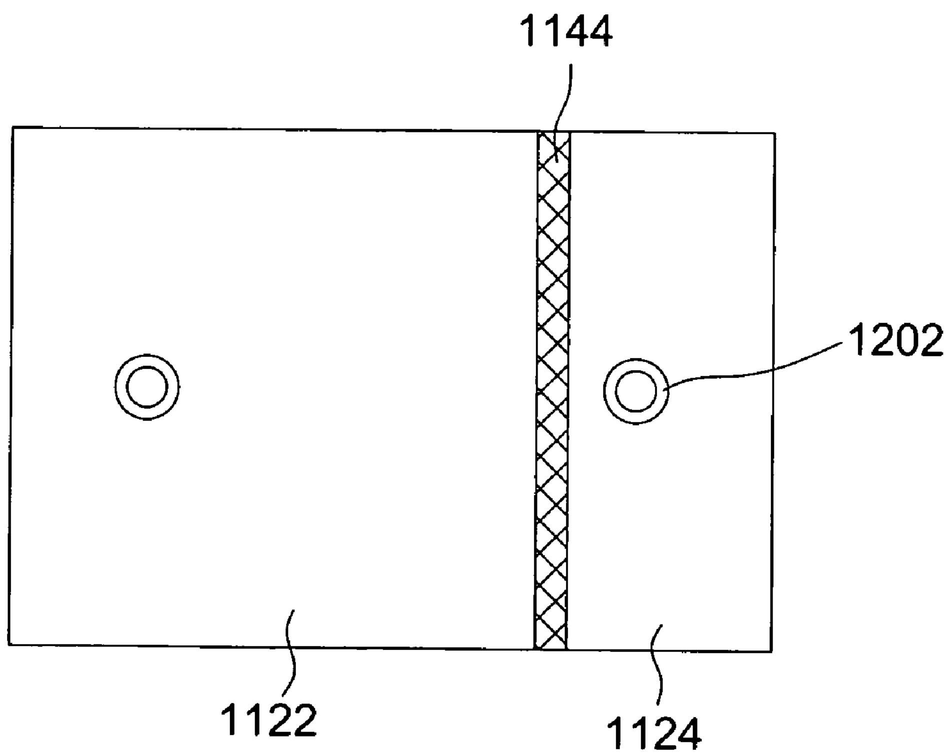

The present invention provides a package structure for a light-emitting diode, so that the light emitting device has excellent heat dissipation ability and provides various applications of electrical connection. FIGS. 1A, 1B, 1C, and 1D respectively illustrate a three dimensional view, a top view, a cross-sectional view, and a bottom view of a light emitting device 101 and a package structure 100 in a first embodiment of the present invention. The package structure 100 includes a conduction board 112, an insulation layer 114, a conductive layer 116, a connection layer 118, and a passage 120. The conduction board 112 has a first portion 1122 and a second portion 1124. The conduction board 112 is preferably a metal board having material selected from a group consisting of copper, aluminum, and the combination thereof for dissipating heat generated by the light emitting diode. The metal board has a thickness in a range from several hundred micrometers to several millimeters, and preferably larger than about 1 mm which facilitates dissipation of heat.

The insulation layer 114 includes an isolation layer 1142 and an insulation channel 1144. The insulation layer 114 can be an insulating adhesive layer having material such as epoxy or Teflon. The isolation layer 1142 disposed between the conduction board 112 and the conductive layer 116 is configured to electrically insulate the conduction board 112 from the conductive layer 116. The isolation layer 1142 may also acts as an adhesive between the conduction board 112 and the conductive layer 116, and has a thickness in a range from about one mil to several tens mils in response to different design needs. The insulation channel 1144, which is disposed within the conduction board 112, is configured to insulate the first portion 1122 from the second portion 1124 of the conduction board 112.

The conductive layer 116 may be a copper layer having a thickness in a range of about 0.1 to several mils or above, or any layer of other conductive materials as appropriate. The combination structure of the conduction board 112, the isolation layer 1142, and the conductive layer 116 can be a conventional printed circuit board structure, such as a metal core printed circuit board (MCPCB). The conductive layer 116 has an opening 1160, and the connection layer 118 is inserted into the insulation layer 114 through the opening 1160. The connection layer 118 is electrically coupled to the conduction board 112, and is electrically insulated from at least one portion of the conductive layer 116. For example, the connection layer 118 is electrically coupled to the first portion 1122 of the conduction board 112 and the first portion 1162 of the conductive layer 116, and insulated from the second portion 1164 of the conductive layer 116 and the second portion 1124 of the conduction board 112.

The connection layer 118 has a surface 118A for supporting and electrically connecting a light emitting element 110, such as a light emitting diode. Furthermore, the connection layer 118 is preferably having a slanted cup-like reflection surface, such as reflection surface 118B, which reflects lights emitted from the light emitting diode upwards. The carrying surface 118A of the connection layer 118 may also be reflective to enhance the reflectance of lights. The connection layer 118 is formed of materials of high reflectance, such as silver or gold, or made of other materials having surfaces 118A and 1181B coated with high reflectivity materials. It is noted that the connection layer 118 is preferably having a slanted cup-like reflection surface, but the shape of the connection layer 118 varies with the design need and not limited to that illustrated in this embodiment.

The passage 120 is configured to couple at least one portion of the conductive layer 116 with the conduction board 112. For example, the passage 120 electrically couples the second portion 1164 of the conductive layer 116 with the second portion 1124 of the conduction board 112. As shown in FIGS. 1A to 1D, the passage 120 includes a hole penetrating through the conductive layer 116, the insulation layer 114, and the conduction board 112, and the hole defines an inner surface coated with a conductive material, such as copper, nickel, silver, gold and the combination thereof.

The package structure 100 further includes a channel 122 for insulating the connection layer 118 from at least one portion of the conductive layer 116. For example, as shown in FIG. 1A, the exemplary channel 122 is in an Omega (Ω) shape, so that the connection layer 118 is electrically insulated from the second portion 1164 of the conductive layer 116. Therefore, though the conduction board 112 is electrically coupled to the connection layer 118, the conduction board 112 and the conductive layer 116 are not short-circuited because of the isolation layer 1142 and the channel 122.

The package structure 100 may further include an insulation filling layer to fill the channel 122 so as to prevent the conductive layer 116 from short-circuiting the conduction board 112 due to the contaminations fallen in the channel 122. Moreover, the connection layer of the package structure 100 may be further inserted into a portion of the conduction board 112. In other words, the connection layer 118 may substantially touch against the conduction boards, while a modified connection layer passing through the insulation layer 114 is inserted into the conduction board 112. For structures having similar conduction board 112, insulation layer 114, and conductive layer 116, changing the depth of inserting the connection layer 118 the reflection surface area is different so as to meet requirements of various applications.

Referring to FIGS. 1A to 1D, the light-emitting device 101 includes a light emitting diode 110 disposed on the package structure 100 as described above. The light emitting diode 110 has a first electrode 110A and a second electrode 110B, such as an N electrode and a P electrode (or negative and positive electrodes). The conduction board 112, the insulation layer 114, and the conductive layer 116 together are the substrate structure. The surface 118A of the connection layer 118 supports and electrically connects the light emitting diode 110 so that the heat generated by the light emitting diode 110 can be dissipated. In such an arrangement, the first electrode 110A of the light emitting diode 110 is electrically coupled to the connection layer 118. The light-emitting device 101 further includes a metal wire 124, such as a gold wire, for coupling the second electrode 110B of the light emitting diode 110 to the conductive layer 116, which is insulated from the connection layer 118. It is noted that the number of the metal wire 124 varies with the thickness of the metal wire and the magnitude of designed operating current.

The insulation channel 1144 and the passage 120 of the present invention effectively prevent the undesired short-circuit between the conduction board 112 and the conductive layer 116, and also provides various applications of electrical connection. For example, the first electrode and the second electrode of the light emitting device may respectively couple with other electronic devices or circuit board through different passage, or couple to external leads of different shapes.

It is noted that the light emitting diode 110 can be assembled in other modified package structures shown in FIGS. 2 to 7 in a similar manner.

Figure 2A:
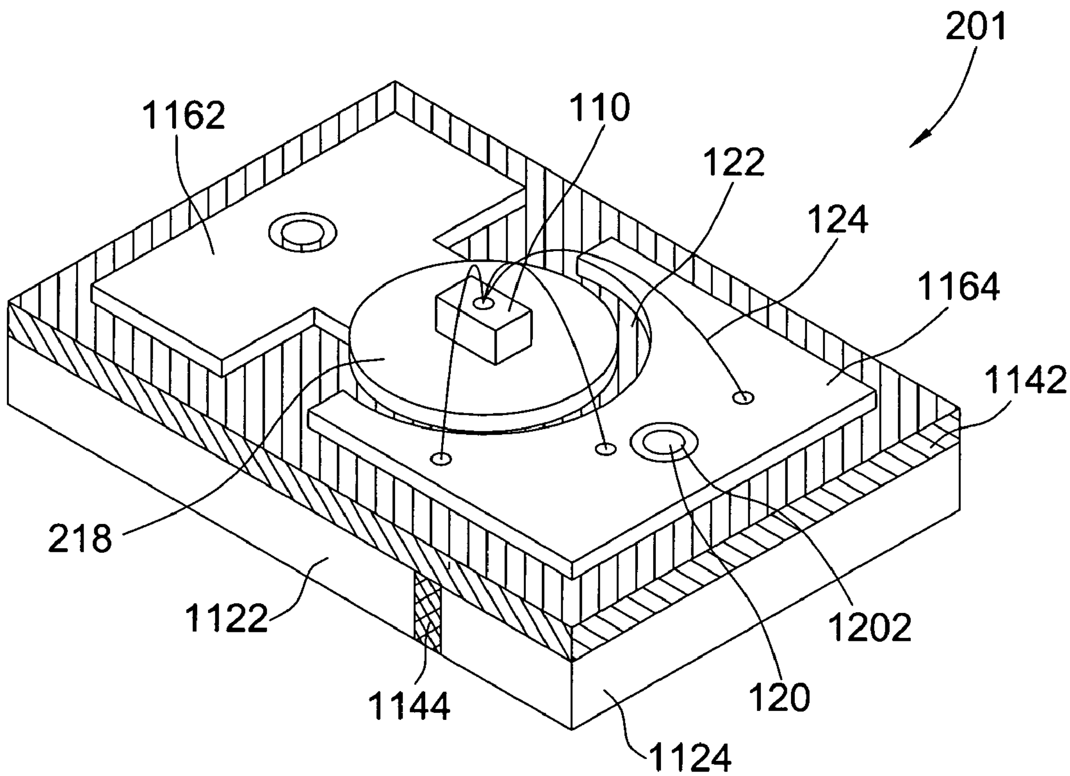
FIGS. 2A–2B illustrate a three-dimensional view and a cross-sectional view of a second embodiment of the present invention.
Figure 2B:
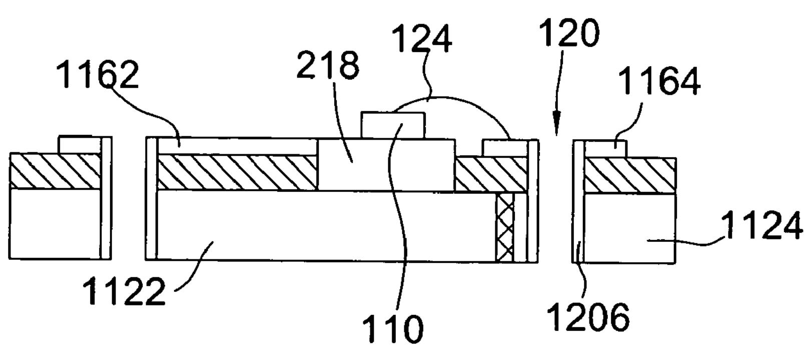

FIGS. 2A and 2B illustrate a three-dimensional view and a cross-sectional view of a light emitting device 201 and the package structure thereof in a second embodiment of the present invention. In this embodiment, the conduction board 112, the insulation layer 114, the conductive layer 116 and the passage 120 are similar to those described in the first embodiment and not elaborated once again. The differences between the first and the second embodiment are described hereinafter.

As shown in FIGS. 2A and 2B, the connection layer 218 is a filling conduction layer selected from a group consisting of copper, nickel, silver, gold, and the combination thereof. In such an arrangement, lights emitted from the light emitting diode 110, which has a relative smaller thickness, won't be hindered by the isolation layer 1142 and the conductive layer 116.

Figure 3A:
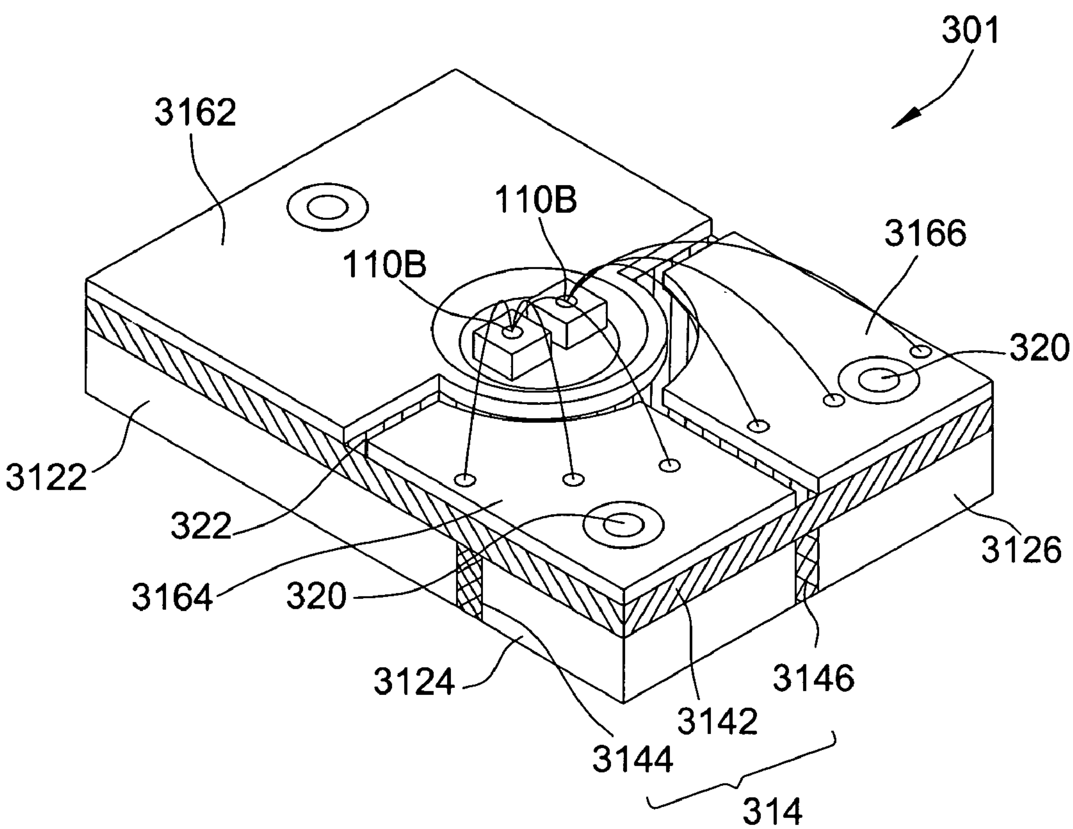
FIGS. 3A–3B illustrate a three-dimensional view and a bottom view of a third embodiment of the present invention.
Figure 3B:
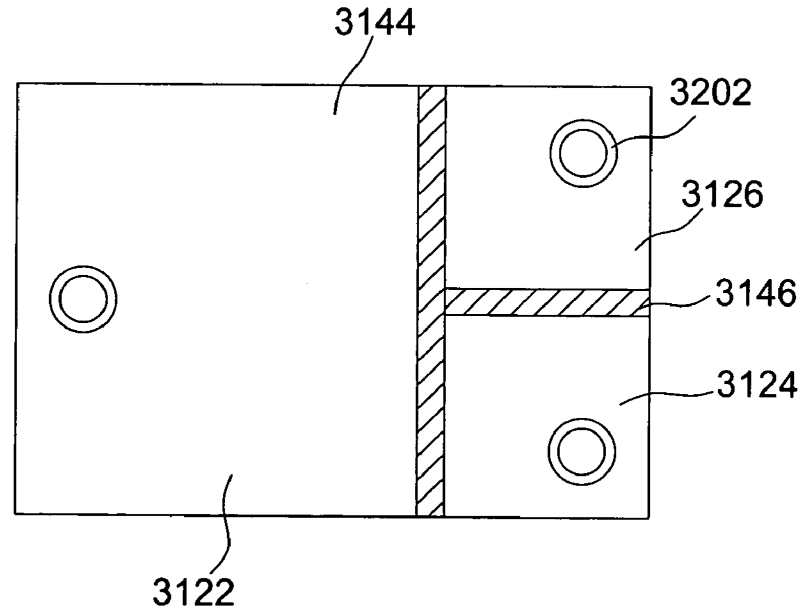

Referring to FIGS. 3A and 3B, in a third embodiment, different from the above embodiments, the light emitting device 301 assembled in a package structure having a channel 322 not only for insulating the connection layer 118 from a conductive layer 316, but also dividing the conductive layer 316 into three portions, 3162, 3164, and 3166. In other words, the first portion 3162 of the conductive layer 316 is electrically coupled to the connection layer 118, while the second portion 3164 and the third portion 3166 are electrically insulted from the connection layer 118. Furthermore, the insulation layer 314 includes an isolation layer 3142 and two insulation channels 3144 and 3146. The isolation layer 3142 insulates the conduction board 312 from the conductive layer 316. The two insulation channels 3144 and 3146 are arranged in a T shape to divide the conduction board 312 into a first portion 3122, a second portion 3124, and a third portion 3126, which are insulated from each other. The first portion 3122 of the conduction board 312 is electrically coupled to the connection layer 118, and the second portion 3124 and the third portion 3126 respectively correspond to the second and third portions 3164 and 3166 of the conductive layer 316. The passage 320 acts in a way similar to those described above, which is a penetration hole covered with a conductive layer 3202 and configured to electrically couple the conduction board 312 with the first and the second portions 3164 and 3166 of the conductive layer.

In this case, two light emitting diodes 110 emitting lights in the same color or in different colors can be disposed together on the connection layer 118. Electrodes of each of the light emitting diodes 110 can be coupled in a way similar to that described above. For example, each first electrode 110A of the light emitting diode 110 is not only electrically coupled to the conduction board 312 but also to the first portion 3162 of the conductive layer 316, while each second electrode 110B of the light emitting diode 110 is coupled to a corresponding portion of the conductive layer 316 which is insulated from the connection layer 118, for example, 3164 or 3166. Therefore, by controlling the operating current flowing to the portions 3164 and 3166 of the conductive layer 316, the brightness or color of lights of the light-emitting device can be adjusted. Moreover, the first electrode 110A of the light emitting diode 110 can have further electrical connections through the conduction board 312, the portion 3162 of the conductive layer 316, or the passage 320, while the second electrode 110B can have further electrical connections through the portions 3164 and 3166 of the conductive layer 316 or the passage 320.

Figure 4A:
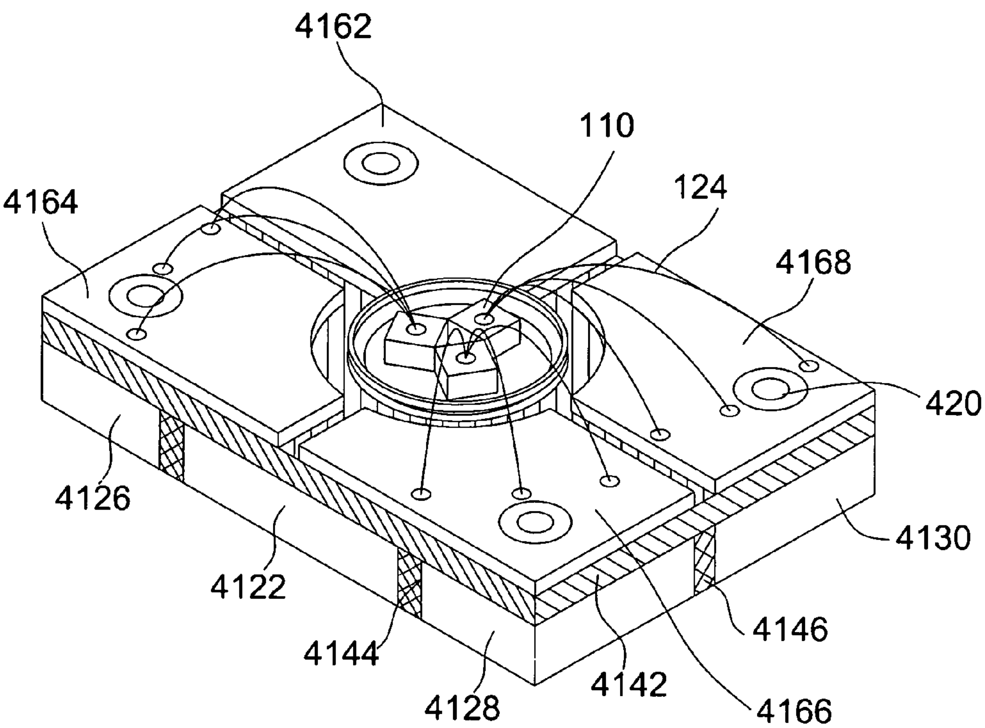
FIGS. 4A–4B illustrate a three-dimensional view and a bottom view of a fourth embodiment of the present invention.
Figure 4B:
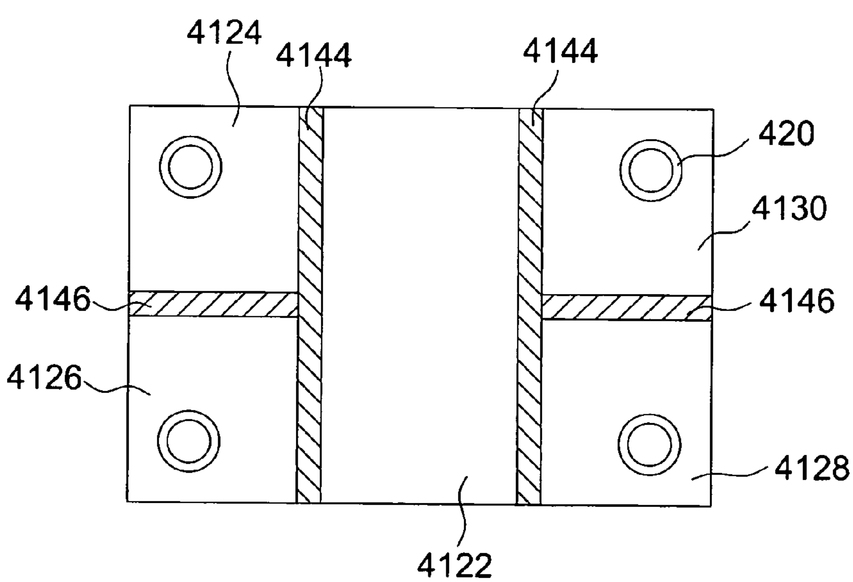

As shown in FIGS. 4A and 4B, the difference of a light emitting device 401 assembled in a package structure of a fourth embodiment is a channel 422 not only insulating the connection layer 118 from a conductive layer 416, but also dividing the conductive layer 416 into four portions, 4162, 4164, 4166, and 4168, so as to insulate the connection layer 118 from three portions of the conductive layer 416. In other words, the portion 4162 of the conductive layer 416 is electrically coupled to the connection layer 118, while the portions 4164, 4166, and 4168 are electrically insulted from the connection layer 118. Furthermore, the insulation layer 414 includes an isolation layer 4142 and a plurality of insulation channels 4144 and 4146. The isolation layer 4142 electrically insulates the conduction board 412 from the conductive layer 416. The insulation channels 4144 and 4146 are arranged in two T shapes to divide the conduction board 412 into five portions, such as 4122, 4124, 4126, 4128, and 4130, which are insulated from each other. The passages 420 couple the conduction board 412 with a corresponding portion of the conductive layer 416 respectively. In this case, three light emitting diodes 110 emitting lights in the same color or in different colors can be disposed together on the connection layer 118. Electrodes of each of the light emitting diodes 110 can be coupled in a way similar to that described above. It is noted that the first portion 4122 and the second portion 4124 of the conduction board 412 are electrically coupled to the connection layer 118, so that the insulation channels 4144 and 4146 can be designed to divide the conduction board into four portions instead of five portions. In other words, the insulation channel between the first portion 4122 and the second portion 4124 may be eliminated.

Figure 5A:
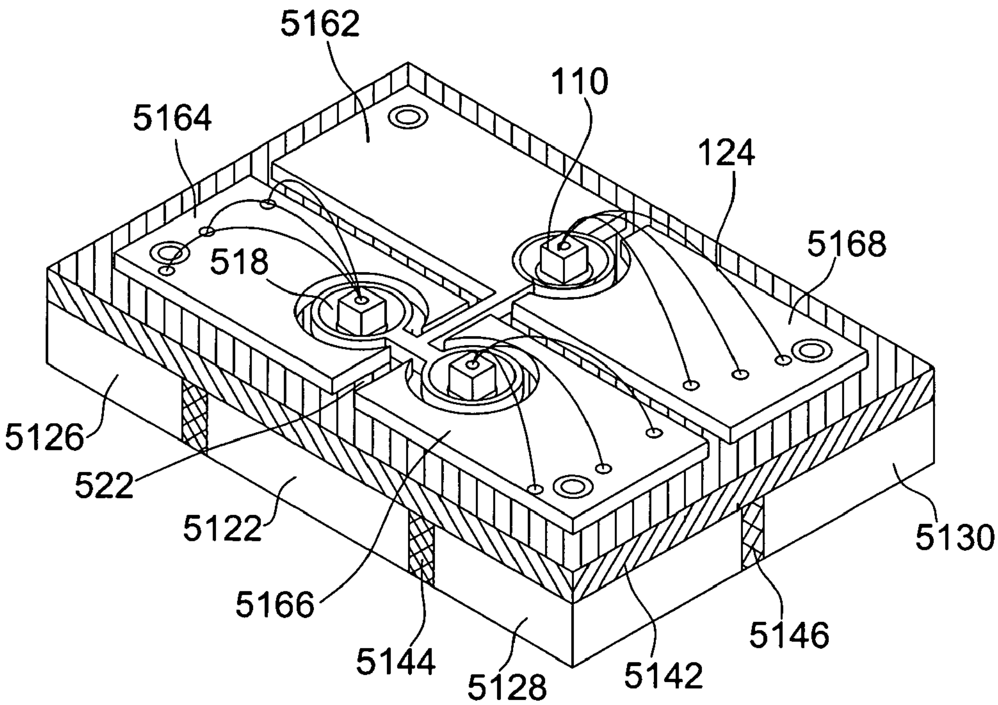
Figure 5B:
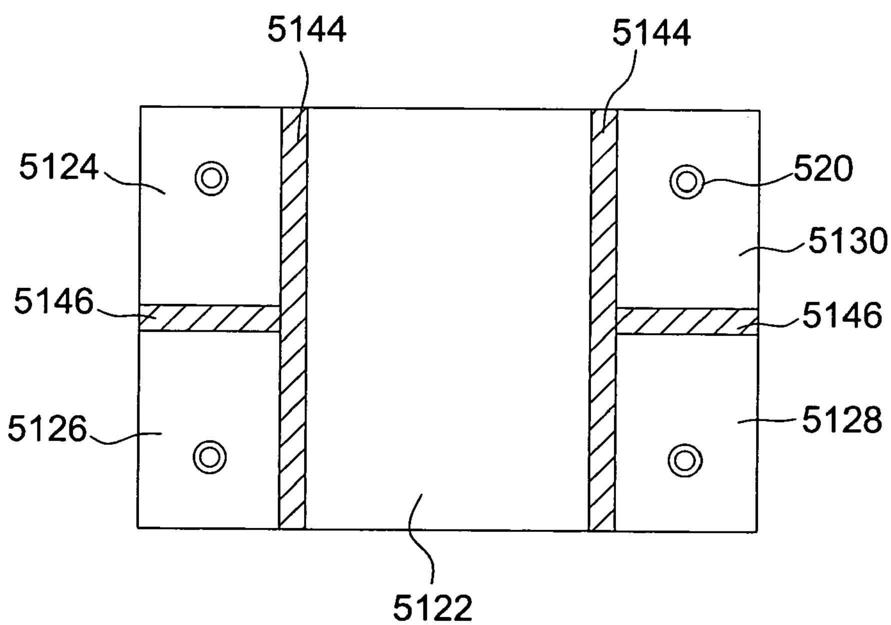

FIGS. 5A and 5B illustrate a three-dimensional view and a bottom view of a light emitting device 501 in a fifth embodiment of the present invention. Different from the package structure of the fourth embodiment, the package structure of the light emitting device 501 includes three coupled cup-like connection layers 518, a channel 522 and insulation layer 514 arranged in different shapes and positions. In other words, the channel 522 divides the conductive layer 516 into four portions 5162, 5164, 5166, and 5168. The portions 5164, 5166 and 5168 are not coupled to any of the three connection layers 518 in order not to hinder the heat dissipation of the light emitting diode. The insulation channels 5144 and 5146 are designed in a way similar to that in the forth embodiment, which divides the conduction board 512 into portions corresponding to four portions of the conductive layer 516.

FIGS. 6A, 6B, 6C, and 6D respectively illustrate a three-dimensional view, a top view, a cross-sectional view and a bottom view of a light emitting device 601 in a flip chip package structure. The light emitting device 601 includes a conduction board 612, an insulation layer 614, and a conductive layer 616 arranged in a way similar to those described above.

The conduction board 612 has a first portion 6122 and a second portion 6124. The conductive layer 616 has an opening 6160 to expose a surface portion 6120 of the conduction board 612. The insulation layer 614 includes an isolation layer 6142 and an insulation channel 6144. The isolation layer 6142 electrically insulates the conduction board 612 from the conductive layer 616. The insulation channel 6144 electrically insulates the first portion 6122 from the second portion 6124 of the conduction board 612. The light emitting diode 610 having a first electrode 610A and a second electrode 610B is disposed on the exposed portion 6120 of the conduction board 612. The first electrode 610A and the second electrode 610B respectively couple to the first portion 6122 and the second portion 6124 of the conduction board 612 via the exposed portion 6120 of the conduction board 612.

Figure 6A:
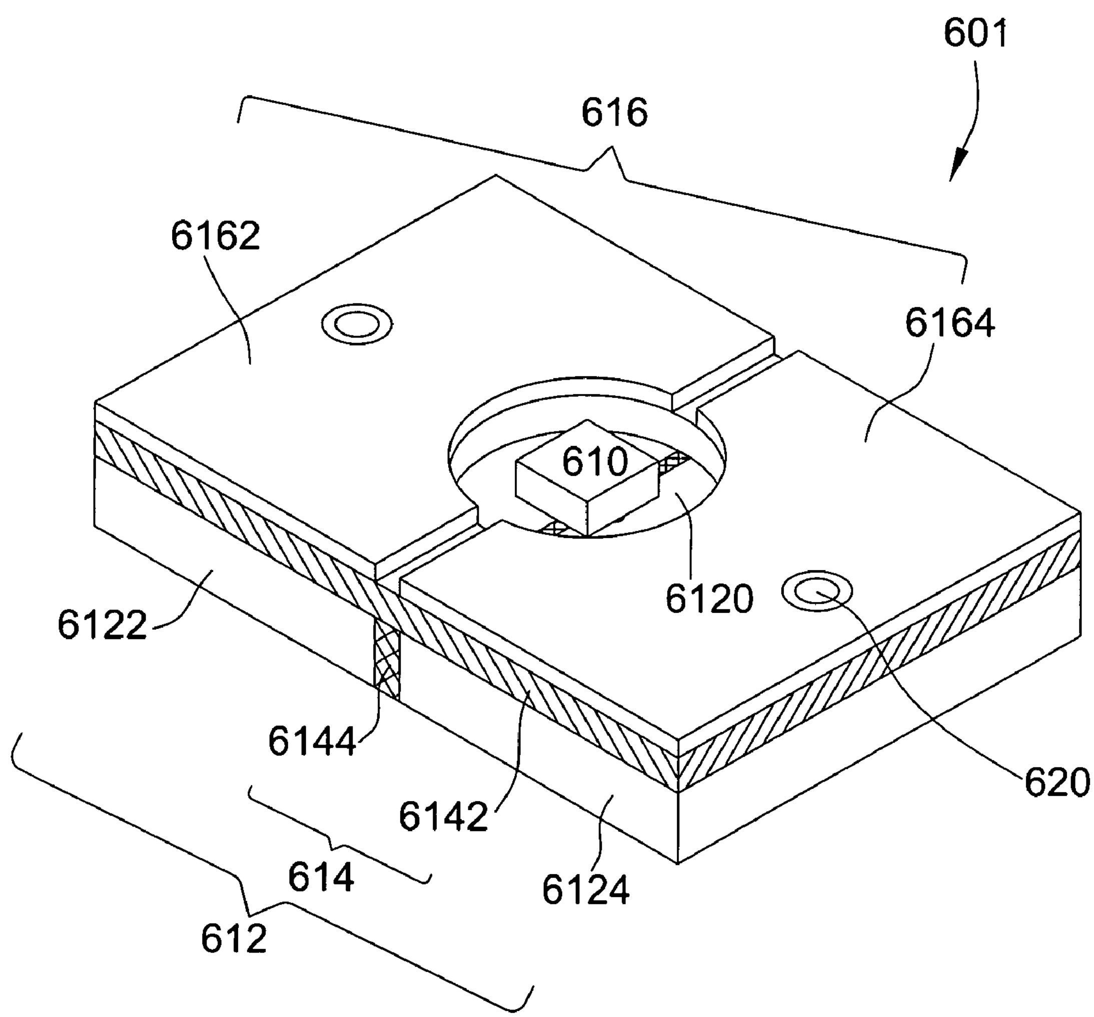
FIGS. 6A–6D illustrate a three-dimensional view, a top view, a cross-sectional view, and a bottom view of a sixth embodiment of the present invention.
Figure 6B:
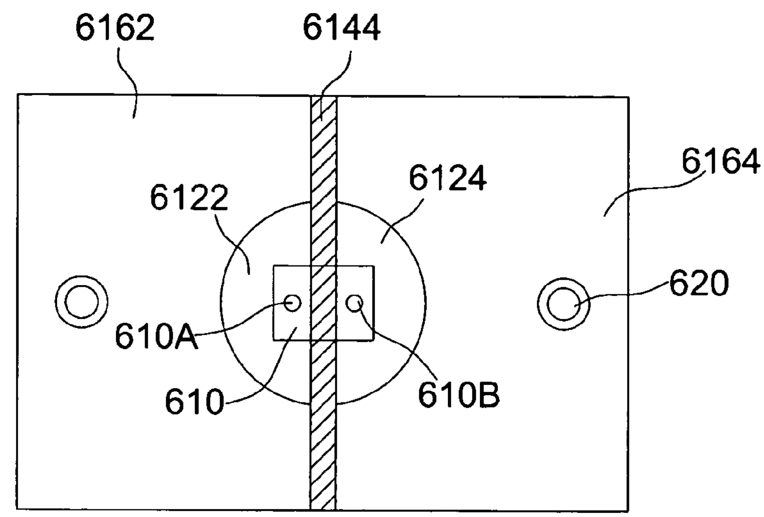
Figure 6C:
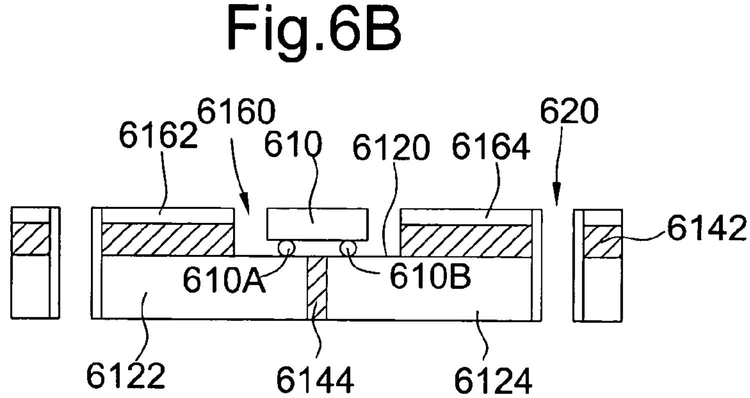
Figure 6D:
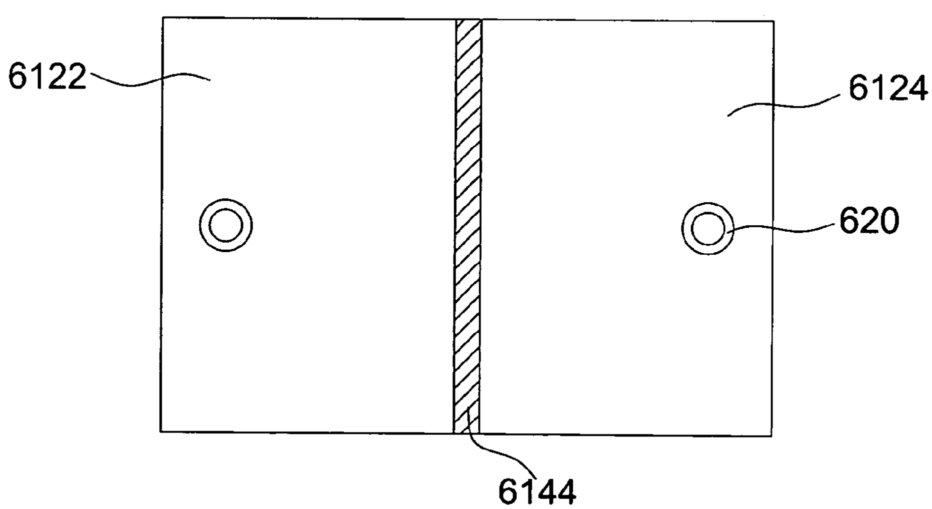

As shown in FIG. 6C, the exposed surface 6120 of the conduction board 612 includes a partial surface of the first portion 6122 and a partial surface of the second portion 6124, which are insulated from each other by the insulation channel 6144. In such an arrangement, the light emitting diode 610 can be electrically coupled to the first portion 6122 and the second portion 6124 by means of solder balls 610A and 610B using the flip chip package technology. Two passages 620 are configured to respectively electrically couple the conductive layer 616 with the first portion 6122 and the second portion 6124 of the conduction board. 612. For example, one passage 620 electrically couples the first portion 6122 of the conduction board 612 with the first portion 6162 of the conductive layer 616, while the other passage 620 electrically couples the second portion 6124 of the conduction board 612 with the second portion 6164 of the conductive layer 616. Furthermore, the passage 620 is a hole penetrating through the conductive layer 616, the insulation layer, and the conduction board 612, and the hole defines an inner surface, which is coated with a conductive material.

Figure 7:
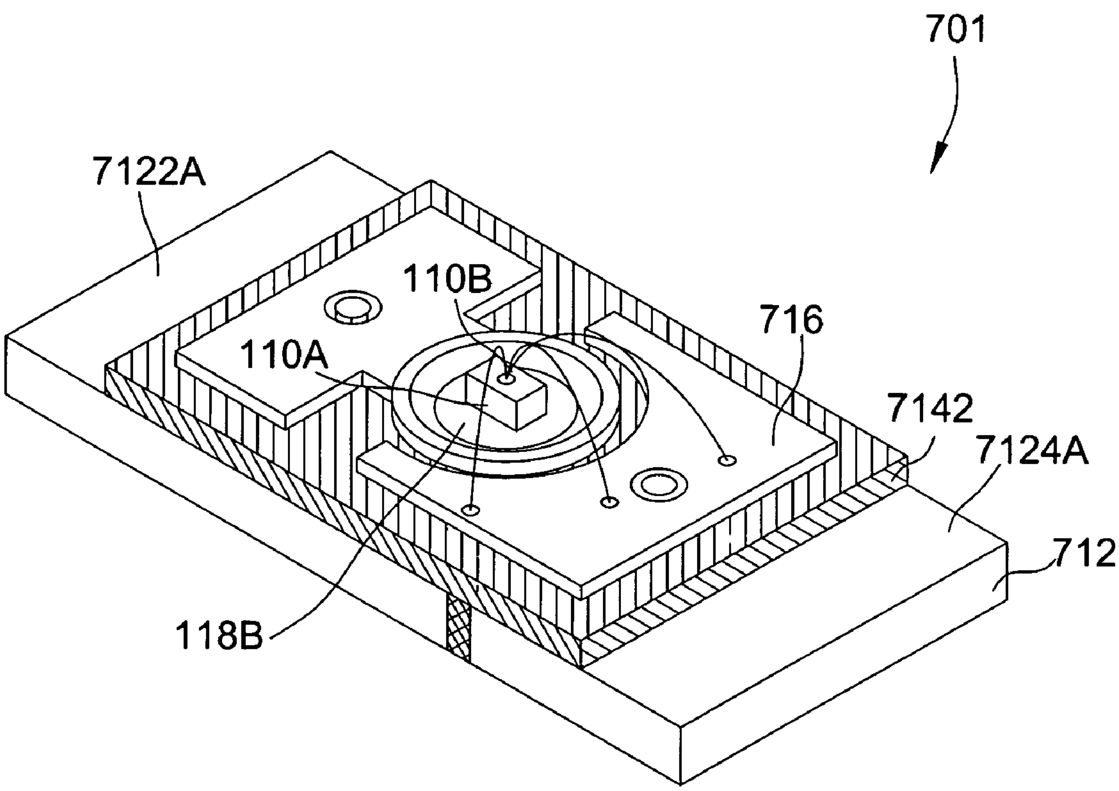
FIG. 7 illustrates a three-dimensional view of a seventh embodiment of the present invention.

The package structure of the present invention may include other modifications. As shown in FIG. 7, a light emitting device 701 in the seventh embodiment of the present invention is disposed on a package structure, which has a conduction board 712 having an area large than those of an isolation layer 7142 and a conductive layer 716. In other words, the first and second portions of the conduction board 712 underlying the isolation layer 7142 and the conductive layer 716 are extended therefrom and partially exposed. Therefore, other further electrical connections of package applications are made possible through the exposed surface 7122A of the first portion 7122 and the exposed surface 7124A of the second portion 7124.

Figure 8A:
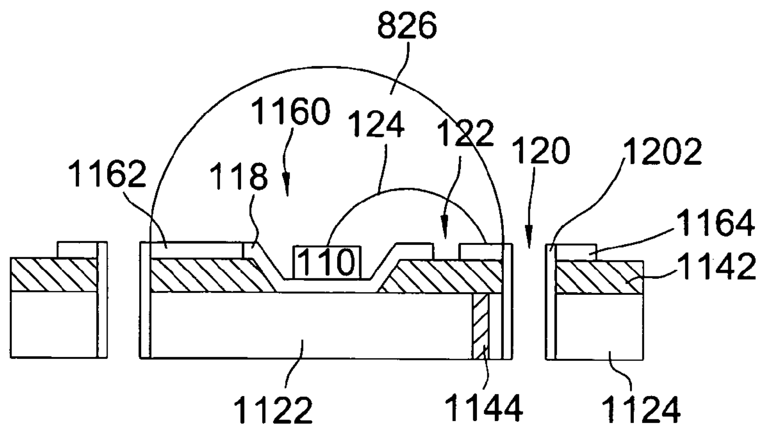
FIGS. 8A–8C illustrate cross-sectional views of different optical structures implemented in the first and the second embodiment respectively.
Figure 8B:
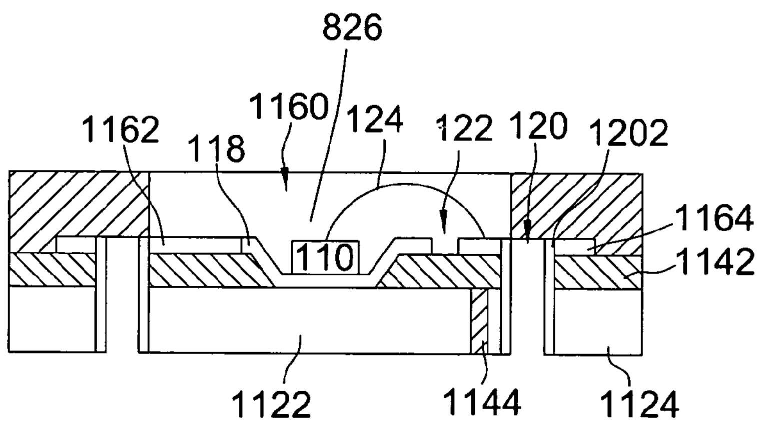
Figure 8C:
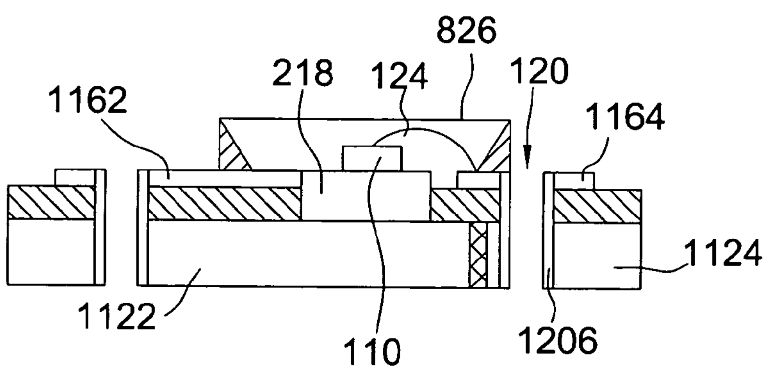

Furthermore, according to different optical design need, the light emitting device of the present invention can have different optical structure to condense lights. As shown in FIGS. 8A, 8B, and 8C, the light emitting devices 101 shown in FIGS. 1 and 2 are covered with a lens or filled with glue to form a light condensing structure 826. The shape of the light condensing structure 826 can be varied with different light pattern as desired. For example, by using silicone or other soft materials to cover the light emitting diode prevents the light emitting diode from damage by thermal expansion when it is operated under high power. Moreover, by adding fluorescent materials into the light condensing structure can adjust the color of light when the light emitting diode is operated.

Figure 9:
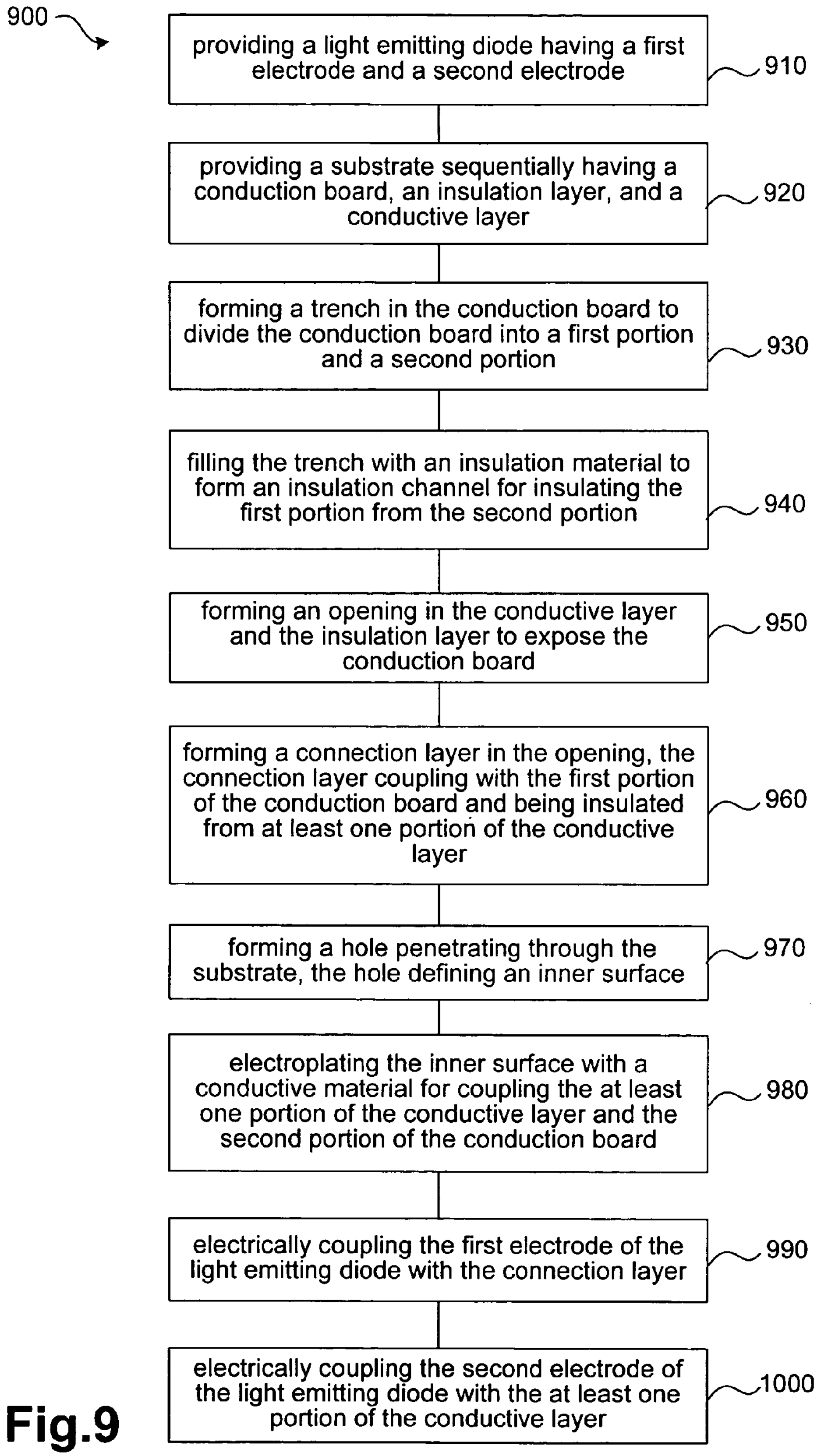
FIG. 9 illustrates a flow chart of assembling a light emitting device in one embodiment of the present invention.

Referring to both FIGS. 1 and 9, a method for assembling a light-emitting device is provided. In this embodiment, FIG. 9 represents a flow diagram of forming the light-emitting device shown in FIG. 1. The method includes step 910 of providing a light emitting diode 110 having a first electrode 110A and a second electrode 110B. In step 920, a substrate from bottom to top sequentially including a conduction board 112, an insulation layer 114, and a conductive layer 116 is provided. The substrate can be a conventional commercial printed circuit board, or a substrate formed by stacking desired layers according to the design need. In step 930, a trench is formed in the conduction board 112 to divide the conduction board 112 into a first portion 1122 and a second portion 1124. In step 940, the trench is filled with an insulation material to form an insulation channel 1144, which insulates the first portion 1122 from the second portion 1124.

An opening is then formed in the conductive layer 116 and the insulation layer 114 to expose the conduction board 112 in step 950. Then, in step 960, a connection layer 118 is formed in the opening so that the connection layer 118 couples with the first portion 1122 of the conduction board 112 and is insulated from at least one portion (such as the second portion 1164) of the conductive layer 116. In step 970, a hole penetrating through the substrate is formed. The hole defines an inner surface, which is electroplated with a conductive material, so that the second portion 1164 of the conductive layer 116 is coupled to the second portion 1124 of the conduction board 112 in step 980. In step 990, the first electrode 110A of the light emitting diode 110 is electrically coupled with the connection layer 118, and in step 110, the second electrode 110B of the light emitting diode 110 is electrically coupled with the second portion 1164 of the conductive layer 116.

The step of forming the connection layer can be achieved by conventional technologies, such as electroplating, evaporation, and sputtering, to form a slanted cup-like connection layer 118 as shown in FIG. 1. The connection layer 218 of FIG. 2 can be deposited by electroplating, evaporation, or sputtering processes. The method further includes a step of forming a channel 122 to insulate the connection layer 118 from the conductive layer 116. The step of forming the channel 122 includes forming a plurality of channels to divide the conductive layer into multiple portions, so that the connection layer is electrically insulated from at least two portions of the conductive layer.

The method further includes a step of forming an insulating filling layer in the channel 122 to electrically insulate the connection layer from the conductive layer 116. The method further includes forming an adhesive layer on the connection layer to electrically couple the first electrode 110A of the light emitting diode 110 with the connection layer. The method includes forming a metal wire 124 to electrically couple the second electrode 110B of the light emitting diode 110 with the portion of the conductive layer 116, which is insulated from the connection layer 118, such as the second portion 1164 of the conductive layer 116.

Although specific embodiments have been illustrated and described, it will be obvious to those skilled in the art that various modifications may be made without departing from what is intended to be limited solely by the appended claims.

What is claimed is:

1. A package structure for a light emitting diode, comprising:
- a conduction board having a first portion and a second portion;
- a conductive layer having an opening;
- an insulation layer, disposed between said conduction board and said conductive layer, for separating said conduction board from said conductive layer and electrically insulating said first portion from said second portion of said conduction board;
- a connection layer, embedded into said insulation layer through said opening, for supporting and electrically connecting said light emitting diode, said connection layer electrically coupling with said first portion of said conduction board and being electrically insulated from at least one portion of said conductive layer; and
- a passage for electrically coupling said at least one portion of said conductive layer with said second portion of said conduction board.

2. The package structure of claim 1, wherein said insulation layer comprises an isolation layer and an insulation channel, said isolation layer insulates said conduction board from said conductive layer, and said insulation channel insulates said first portion from said second portion of said conduction board.

3. The package structure of claim 1, comprising a channel for insulating said connection layer from said at least one portion of said conductive layer.

4. The package structure of claim 1, wherein said conduction board is a metal board having material selected from a group consisting of copper, aluminum, and the combination thereof for dissipating heat generated by said light emitting diode, and said metal board has a thickness larger than about 1 mm.

5. The package structure of claim 1, wherein said insulation layer comprises an insulating adhesive layer including epoxy.

6. The package structure of claim 1, wherein said conductive layer is a copper layer having a thickness in a range of about 0.1 to several mils or above.

7. The package structure of claim 1, wherein said connection layer has a reflection surface of silver for reflecting lights emitted from said light emitting diode.

8. The package structure of claim 1, wherein said connection layer has a slanted cup-like reflection surface.

9. The package structure of claim 1, wherein said connection layer is selected from a group consisting of copper, nickel, silver, gold, and the combination thereof.

10. The package structure of claim 1, wherein said passage comprises a hole penetrating through said conductive layer, said insulation layer, and said conduction board, and said hole defines an inner surface coated with a conductive material.

11. The package structure of claim 10, wherein said conductive material is selected from a group consisting of copper, nickel, silver, gold, and the combination thereof.

12. A light emitting device, comprising:
- a light emitting diode having a first electrode and a second electrode;
- a substrate sequentially having a conduction board, an insulation layer, and a conductive layer, said conduction board having a first portion and a second portion, said insulation layer for separating said conduction board from said conductive layer and electrical insulating said first portion from said second portion of said conduction board, said conductive layer having an opening;
- a connection layer, embedded into said insulation layer through said opening, for supporting and electrically connecting said light emitting diode, said connection layer electrically coupling with said conduction board and being electrically insulated from at least one portion of said conductive layer; and
- a passage for electrically coupling said at least one portion of said conductive layer with said second portion of said conduction board;
- wherein said first electrode of said light emitting diode couples with said connection layer, and said second electrode couples with said at least one portion of said conductive layer.

13. The light emitting device of claim 12, comprising a channel for insulating said connection layer from said at least one portion of said conductive layer.

14. The light emitting device of claim 12, comprising a metal wire for coupling said second electrode of said light emitting diode with said at least one portion of said conductive layer.

15. The light emitting device of claim 12, wherein said connection layer has a reflection surface of silver for reflecting lights emitted from said light emitting diode.

16. The light emitting device of claim 15, wherein said connection layer has a slanted cup-like reflection surface.

17. The light emitting device of claim 12, wherein said connection layer is selected from a group consisting of copper, nickel, silver, gold, and the combination thereof.

18. The light emitting device of claim 12, wherein said passage comprises a hole penetrating through said conductive layer, said insulation layer, and said conduction board, and said hole defines an inner surface coated with a conductive material.

* * * * *

UNITED STATES PATENT AND TRADEMARK OFFICE

CERTIFICATE OF CORRECTION

PATENT NO. : 6,984,852 B2
APPLICATION NO. : 10/770921
DATED : January 10, 2006
INVENTOR(S) : Pai-Hsiang Wang et al.

It is certified that error appears in the above-identified patent and that said Letters Patent is hereby corrected as shown below:

In Column 10, line 30, delete "electrical" and add "electrically"

Signed and Sealed this

Fifth Day of May, 2009

JOHN DOLL
*Acting Director of the United States Patent and Trademark Office*